United States Patent
Peng et al.

(10) Patent No.: US 9,414,518 B2
(45) Date of Patent: Aug. 9, 2016

(54) ELECTRONIC APPARATUS

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Wen-Tang Peng, New Taipei (TW); Xiao-Zheng Li, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 71 days.

(21) Appl. No.: 14/557,624

(22) Filed: Dec. 2, 2014

(65) Prior Publication Data
US 2015/0173240 A1  Jun. 18, 2015

(30) Foreign Application Priority Data
Dec. 18, 2013 (CN) .......................... 2013 1 0696100

(51) Int. Cl.
*H05K 7/20* (2006.01)
*F04D 19/00* (2006.01)
*F04D 29/60* (2006.01)

(52) U.S. Cl.
CPC .......... *H05K 7/20172* (2013.01); *F04D 19/007* (2013.01); *F04D 29/601* (2013.01); *H05K 7/20718* (2013.01)

(58) Field of Classification Search
CPC ...... H05K 7/20; H05K 7/20172; F04D 29/64; F04D 19/007

USPC .......... 361/679.48, 695, 694, 687; 415/214.1; 416/178
See application file for complete search history.

(56) References Cited

U.S. PATENT DOCUMENTS

| | | | | |
|---|---|---|---|---|
| 5,208,730 A | * | 5/1993 | Tracy | F04D 29/668 361/679.48 |
| 6,244,953 B1 | * | 6/2001 | Dugan | H05K 7/20172 361/695 |
| 6,795,314 B1 | * | 9/2004 | Arbogast | H05K 7/20172 165/104.33 |
| 9,163,637 B2 | * | 10/2015 | Hsieh | F04D 25/0613 |
| 2006/0268514 A1 | * | 11/2006 | Fan | H05K 7/20581 361/695 |

* cited by examiner

*Primary Examiner* — Dion R Ferguson
*Assistant Examiner* — Mandeep S Buttar
(74) *Attorney, Agent, or Firm* — ScienBiziP, P.C.

(57) ABSTRACT

A removable fan module for an electronic apparatus includes a fan connectable to an external power source through a first connector and a chassis removably insertable into the electronic apparatus. The chassis includes a main plate, a first side plate, a second side plate, a first end plate, a second end plate, and a resilient plate extending from the first end of the main plate. A first and second protuberance extends outward from each side edge of the main plate. A first and second tab extends outward from an outer surface of each side plate adjacent the main plate. A latch protrudes from the distal end of the resilient plate. The chassis is attachable to the electronic apparatus by pressing the distal end of the resilient plate toward an opening in the electronic apparatus housing with the housing opening including two defined spaces extending outward from each opening edge.

20 Claims, 6 Drawing Sheets

ELECTRONIC APPARATUS

FIELD

The subject matter herein generally relates to an electronic apparatus.

BACKGROUND

Fan modules are generally installed in a chassis by screws. However, it is inconvenient to install or uninstall the fan modules when maintenance or replacement.

BRIEF DESCRIPTION OF THE DRAWINGS

Implementations of the present technology will now be described, by way of example only, with reference to the attached figures.

DETAILED DESCRIPTION

Figure 1:
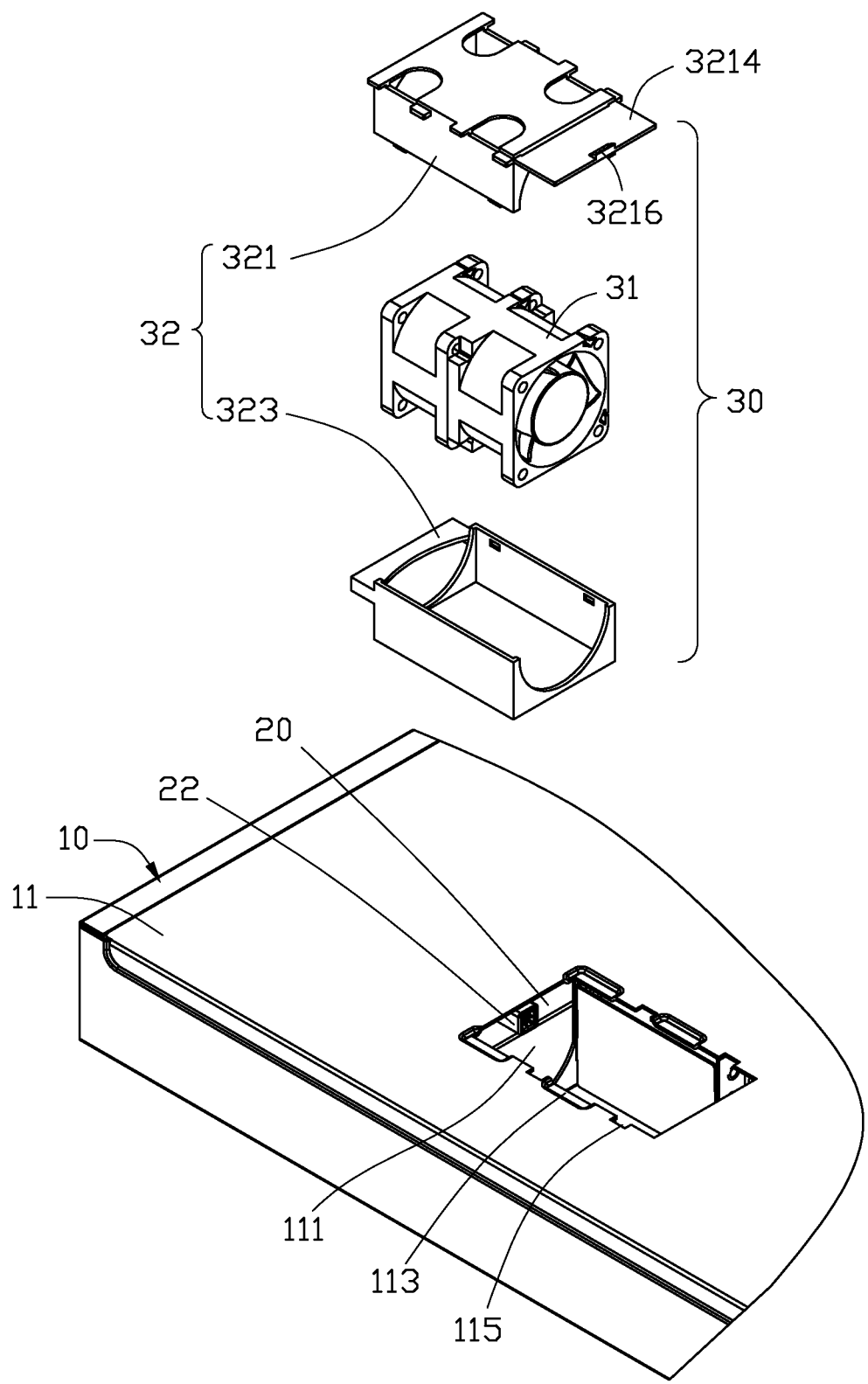
FIG. 1 is an exploded, partially cutaway isometric view of an embodiment of an electronic apparatus, wherein the electronic apparatus includes a fan module.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The present disclosure is described in relation to an electronic apparatus.

FIG. 1 illustrates an embodiment of an electronic apparatus comprising an enclosure 10, a circuit board 20 installed in the enclosure 10, and a fan module 30.

The enclosure 10 includes a side wall 11. The side wall 11 defines a substantially rectangular opening 111 adjacent to the circuit board 20. The side wall 11 adjacent to two opposite side edges of the opening 111 respectively define two spaced notches 113 and two spaced cutouts 115. Each notch 113 is located beside the corresponding cutout 115. In the embodiment, the enclosure 10 is a server chassis, the sidewall 11 is a top wall or bottom wall of the server chassis.

The circuit board 20 is parallel to the side wall 11, and comprises a connector 22 mounted on the circuit board 20 facing an end edge of the opening 111.

Figure 2:
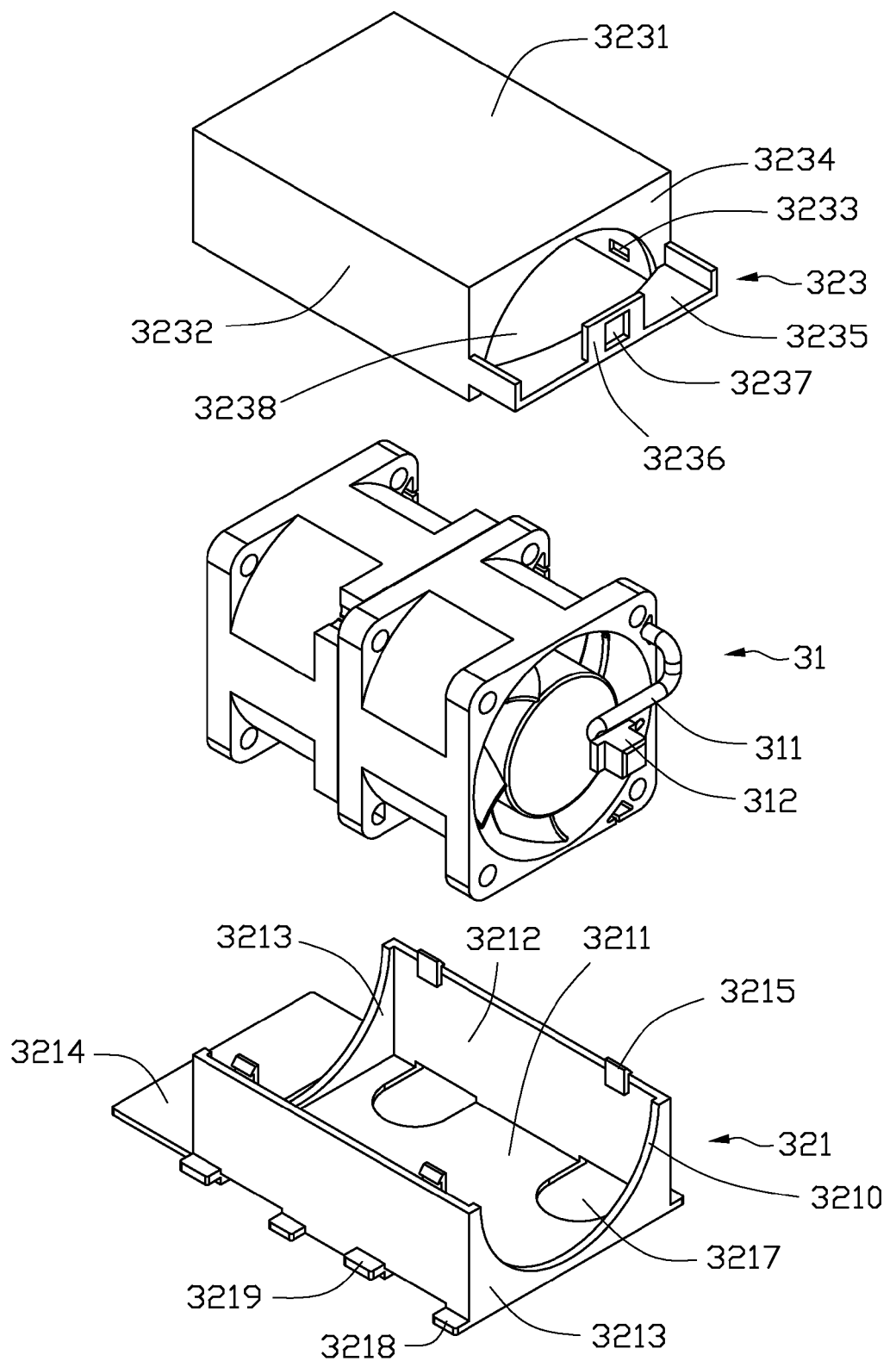
FIG. 2 is an exploded, isometric view of the fan module of FIG. 1.

FIG. 2 illustrates the fan module 30 comprising a fan 31 and a chassis 32 for receiving the fan 31. The fan 31 comprises a cable 311 and a connector 312 connected with a distal end of the cable 311. The chassis 32 comprises a first bracket 321 and a second bracket 323 configured to latch to the first bracket 321.

The first bracket 321 comprises a main plate 3211, two side plates 3212 substantially perpendicularly extending from two opposite side edges of the main plate 3211, two end plates 3213 substantially perpendicularly extending from two opposite end edges of the main plate 3211, and a resilient plate 3214 located at an outer side of one of the end plate 3213. The end plates 3213 are located at the same side with the side plates 3212, and are connected between sides of the side plates 3212. The resilient plate 3214 is parallel to and adjacent to the main plate 3211. The two opposite sides of the main plate 3211 respectively define two operating holes 3217. Two protuberances 3218 protrude from two opposite ends of each side of the main plate 3211, and are located adjacent to the corresponding operating holes 3217. Two spaced tabs 3219 extend out from an outer surface of each side plate 3212, and are located adjacent to the main plate 3211. Two hooks 3215 are formed at an inner surface of each side plate 3212 away from the main plate 3211, and each hook 3215 exposes out the corresponding side plate 3212. A middle of each end plate 3213 defines a substantially semicircular vent 3210. A substantially wedge-shape latch 3216 protrudes from a distal end of the resilient plate 3214, opposite to the end plates 3213.

The second bracket 323 comprises a bottom plate 3231, two side plates 3232 substantially perpendicularly extending from two opposite side edges of the bottom plate 3231, and two end plates 3234 substantially perpendicularly extending from two opposite end edges of the bottom plate 3231. The end plates 3234 are located at the same side with the side plates 3232, and are connected between sides of the side plates 3232. An inner surface of each side plate 3232 defines two latching holes 3233 away from the bottom plate 3231. A middle of each end plate 3234 defines a substantially semicircular vent 3238. An installing plate 3235 extending out from one of the end plates 3234. The installing plate 3235 is parallel to and away from the bottom plate 3231. A positioning plate 3236 extends from a middle of a distal end of the installing plate 3235 toward the bottom plate 3231. A middle of the positioning plate 3236 defines a positioning hole 3237.

Figure 3:
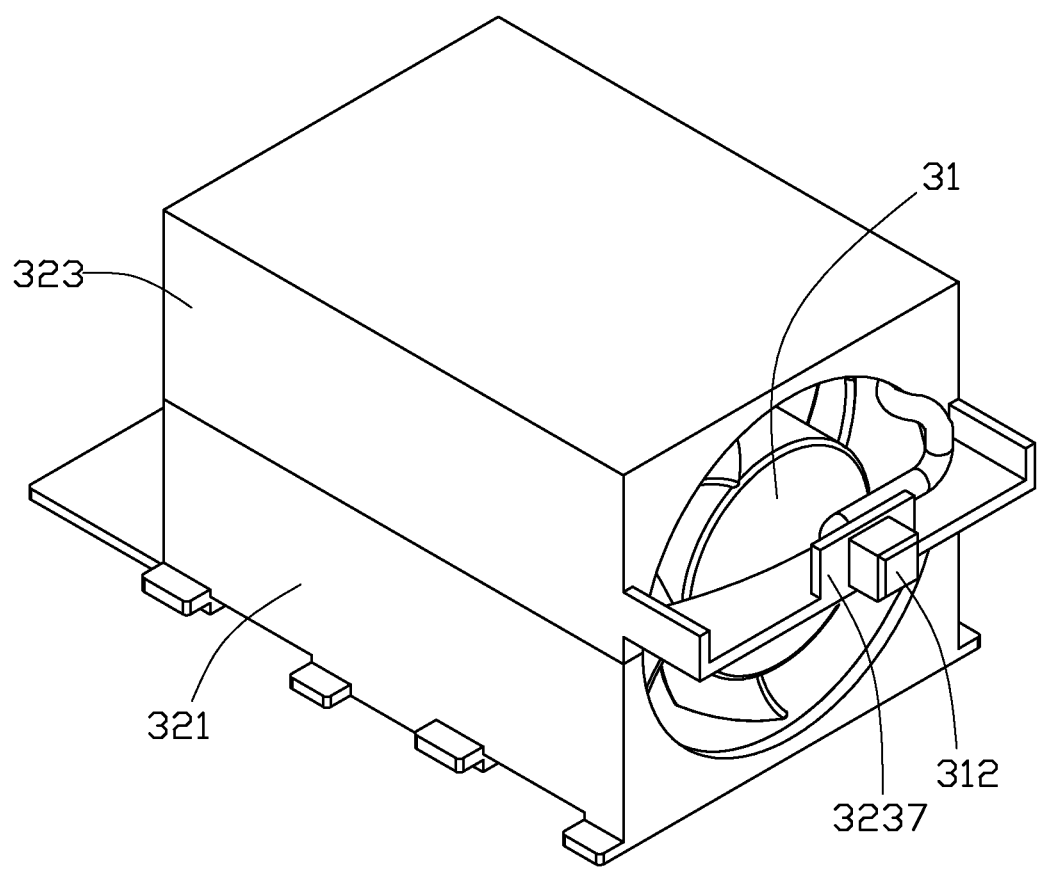
FIG. 3 is an assembled, isometric view of the fan module of FIG. 2.

FIG. 3 illustrates that the fan module 30 to be assembled, the fan 31 is received in the first bracket 321, and the second bracket 323 covers on the fan 31. The side plates 3232 of the second bracket 323 aligns with the corresponding side plates 3212 of the first bracket 321, and the installing plate 3235 is located away from the resilient plate 3214. The first bracket 321 and the second bracket 323 are pressed toward each other, deforming the hooks 3215, until the hooks 3215 align with the corresponding latching hole 3233. The hooks 3215 are restored to latch into the corresponding latching holes 3233 of the latching member 323. The connector 312 of the fan 31 is positioned in the positioning hole 3237, and the fan 31 is mounted between the first bracket 321 and the second bracket 323. An air inlet and an air outlet of the fan 30 are aligned with the corresponding vents 3210 and 3238.

Figure 4:
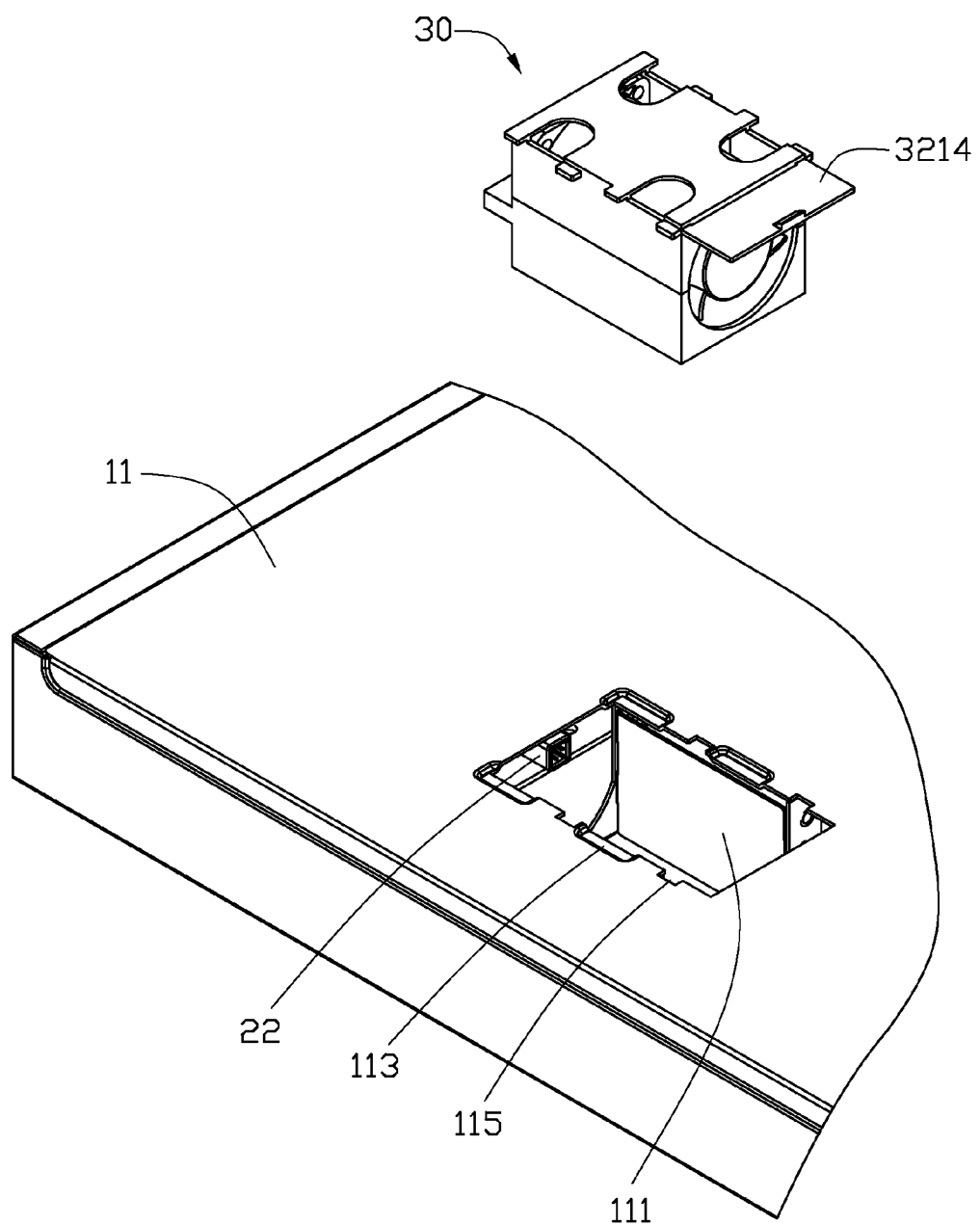
FIG. 4 is a partial assembled, isometric view of the electronic apparatus of FIG. 1.
Figure 5:
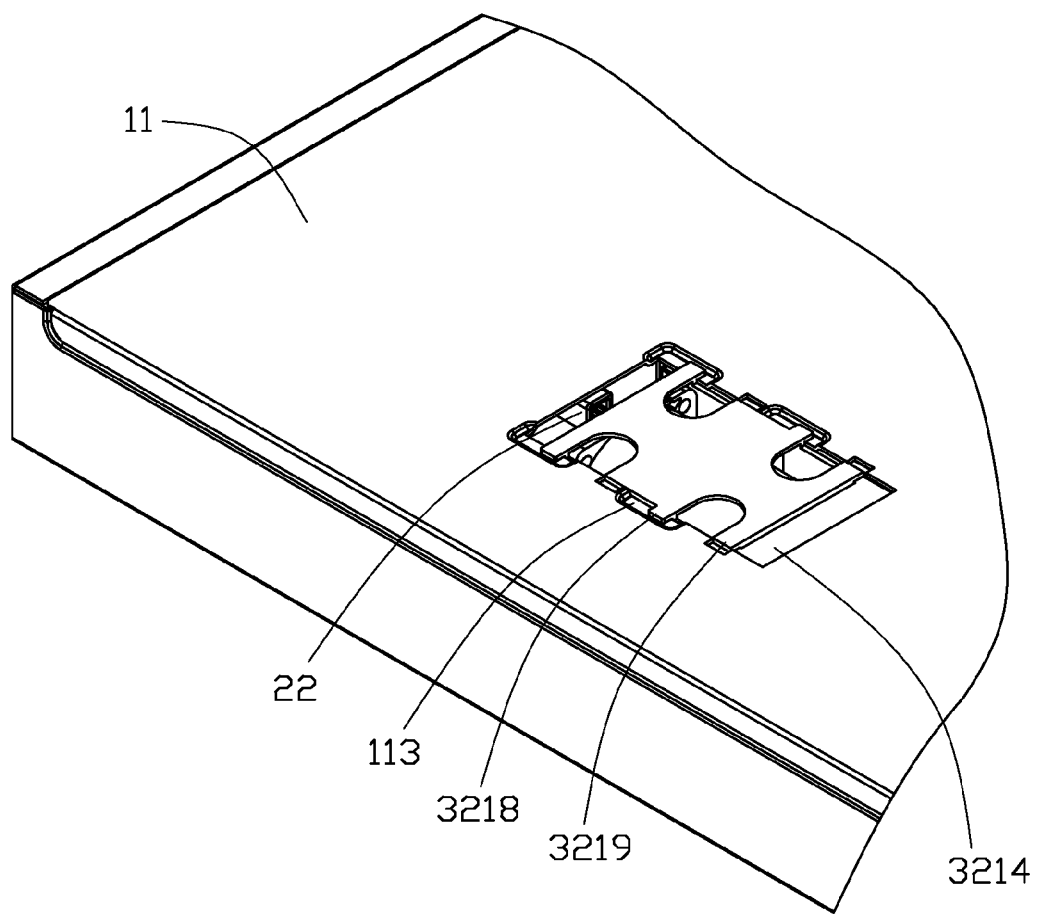
FIG. 5 is an assembled, isometric view of the electronic apparatus of FIG. 1.
Figure 6:
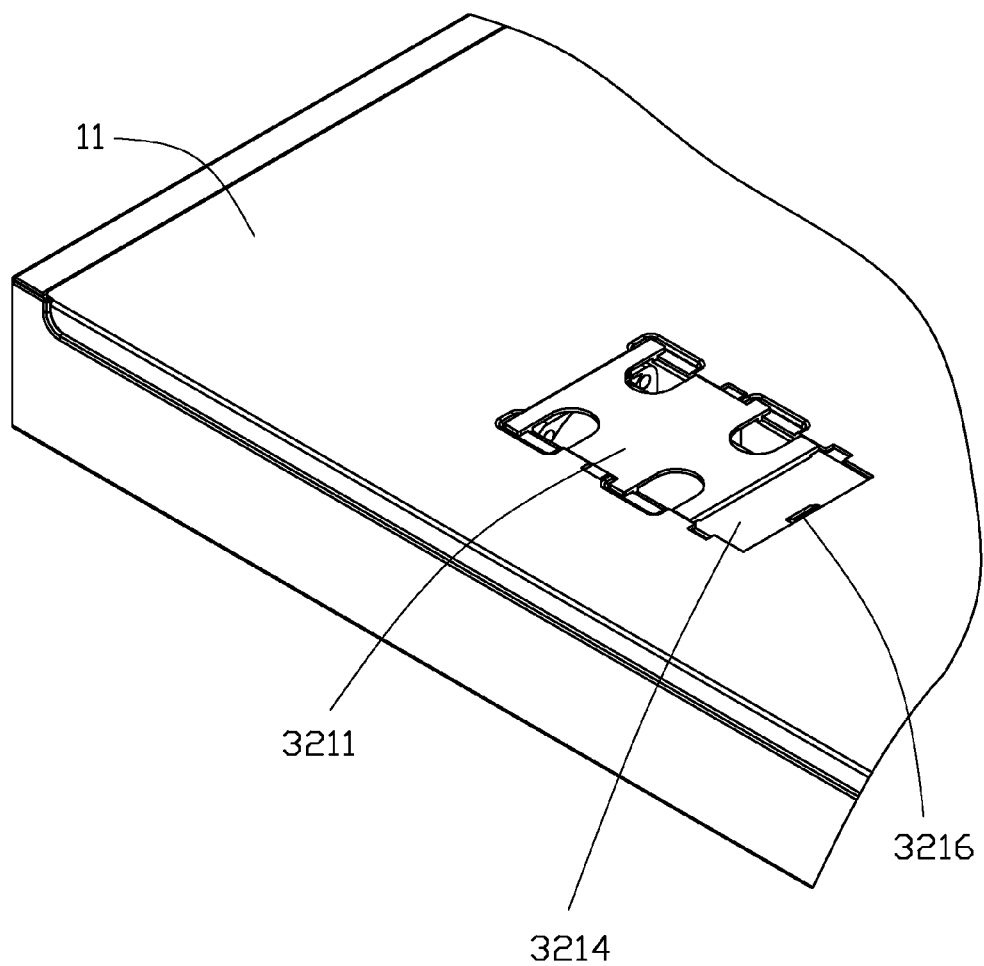
FIG. 6 is similar to FIG. 5, but showing the electronic apparatus in a locked state.

FIGS. 4-6 illustrate that the fan module 30 to be assembled to the enclosure 10, the second bracket 323 of the fan module 30 is inserted into the opening 111 of the enclosure 10. The distal end of the resilient plate 3214 is pressed toward the opening 111, deforming the resilient plate 3214, until the latch 3216 of the resilient plate 3214 abuts against an inner surface of the side wall 11. The protuberances 3218 pass through the corresponding cutouts 115, the tabs 3219 are received in the corresponding notch 113, and the connector 312 of the fan 31 aligns with the connector 22 of the circuit board 20. The fan module 30 is moved toward the connector 22 of the circuit board 20 through operating the operating holes 3217, until the connector 312 of the fan 31 is connected with the connector 22. The resilient plate 3214 is restored to allow the latch 3216 to abut against an end edge of the opening 111 opposite to the connector 22, for avoiding the connector 312 disengaged from the connector 22. The protuberances 3218 abut against the inner surface of the side wall 11 for avoiding the fan module 30 disengaged from the side wall 11. The tabs 3219 are supported on the corresponding notches 113 for avoiding the fan module 30 dropped in the enclosure 10.

The fan module 30 can be disengaged from the enclosure 10, the resilient plate 3214 is pressed down, deforming the resilient plate 3214, and the latch 3216 is disengaged from the end surface of the opening 111. The fan module 30 is slid away from the connector 22 through the operating holes 3217, the connector 312 is disengaged from the connector 22, and the latch 3216 slidably abuts against the inner surface of the side wall 11. The protuberances 3218 are slid into the corresponding cutouts 115, the fan module 30 is pulled from the enclosure 10.

The fan module 30 configured to install to or disengage from the enclosure 10 without need to remove the side wall 11. When the electronic apparatus is installed at a lower portion of a rack, the side wall 11 as a top wall of the electronic apparatus, the fan module 30 configured to be installed to or disengaged from the enclosure 10 above the side wall 11. When the electronic apparatus is installed at an upper portion of a rack, the side wall 11 as a bottom wall of the electronic apparatus, the fan module 30 configured to be installed to or disengaged from the enclosure 10 below the side wall 11.

Even though numerous characteristics and advantages of the embodiments have been set forth in the foregoing description, together with details of the structure and function of the embodiments, the present disclosure is illustrative only, and changes may be made in detail, including in the matters of shape, size, and arrangement of parts within the principles of the embodiments to the full extent indicated by the broad general meaning of the terms in which the appended claims are expressed.

What is claimed is:

1. An electronic apparatus comprising:
    an enclosure comprising a side wall defining an opening, wherein the enclosure defines two cutouts respectively located at two opposite side edges of the opening;
    a circuit board mounted in the enclosure adjacent to the opening, wherein the circuit board comprises a first connector facing the opening; and
    a fan module comprising a chassis and a fan received in the chassis;
    wherein, the fan comprises a second connector, the chassis comprises a first bracket comprising:
        a main plate with two protuberances respectively protruding from two opposite side edges of the main plate;
        two first side plates perpendicularly extending out from the two opposite side edges of the main plate, each first side plate comprising a tab protruding from an outer surface of the first side plate adjacent to the main plate;
        two first end plates perpendicularly extending out form two opposite end edges of the main plate, and connected between the first side plates; and
        a resilient plate located at an outer side of one of the first end plates, wherein the resilient plate comprises a latch protruding from a distal end of the resilient plate away from the first side plates;
    wherein, when in assemble of the fan module to the enclosure, the distal end of the resilient plate is pressed toward the opening, deforming the resilient plate, until the resilient plate abuts against an inner surface of the side wall, the fan module is received in the opening, the protuberances pass through the corresponding cutouts, the tabs are supported on an outer surface of the side wall, the second connector of the fan aligns with the first connector of the circuit board, the fan module is moved toward the first connector, until the second connector is connected with the first connector, the resilient plate is restored to allow the latch to abut against an end edge of the opening opposite to the first connector, for avoiding the second connector disengaged from the first connector, the protuberances abut against the inner surface of the side wall for avoiding the fan module disengaged from the side wall.

2. The electronic apparatus of claim 1, wherein the side wall define two notches locating at the two opposite side edges of the opening, the tabs of the first bracket extend through the corresponding notches when the fan module installed in the opening of the enclosure.

3. The electronic apparatus of claim 1, wherein the chassis further comprises a second bracket latched to the first bracket for mounting the fan between the first bracket and the second bracket.

4. The electronic apparatus of claim 3, wherein the second bracket comprises a bottom plate opposite to the main plate of the first bracket, and two second side plates extending from two opposite side edges of the bottom plate toward the first bracket, each first side plate comprises two hooks located away from the main plate, each second side plate defines two latching holes, the hooks are latched in the corresponding latching holes of the second bracket.

5. The electronic apparatus of claim 4, wherein the second bracket further comprises two second end plates perpendicularly extending out from two opposite end edges of the bottom plate and an installing plate protruding from an outer surface of one of the second end plates, the second connector is mounted to the installing plate.

6. The electronic apparatus of claim 5, wherein each second end plate defines a vent and each first end plate defines a vent.

7. The electronic apparatus of claim 5, wherein the installing plate comprises a positioning plate extending therefrom and defining a positioning hole for the second connector extending therethrough.

8. The electronic apparatus of claim 1, wherein the main plate defines a plurality of operating holes adjacent the side edges thereof, the fan module is moved through the operating holes.

9. A fan module detachably mounted to an enclosure, wherein the enclosure comprises a side wall defining an opening and two cutouts respectively located at two opposite side edges of the opening, and a circuit board with a first connector facing the opening, the fan module comprising:
a chassis comprising a first bracket; and
a fan received in the chassis, wherein the fan comprises a second connector;
wherein the first bracket comprises:
a main plate with two protuberances respectively protruding from two opposite side edges of the main plate;
two first side plates perpendicularly extending out from the two opposite side edges of the main plate, each first side plate comprising a tab protruding from an outer surface of the first side plate adjacent to the main plate;
two first end plates perpendicularly extending out form two opposite end edges of the main plate, and connected between the first side plates; and
a resilient plate located at an outer side of one of the first end plates, wherein the resilient plate comprises a latch protruding from a distal end of the resilient plate away from the first side plates;
wherein, when in assemble of the fan module to the enclosure, the distal end of the resilient plate is pressed toward the opening, deforming the resilient plate, until the resilient plate abuts against an inner surface of the side wall, the fan module is received in the opening, the protuberances pass through the corresponding cutouts, the tabs are supported on an outer surface of the side wall, the second connector of the fan aligns with the first connector of the circuit board, the fan module is moved toward the first connector, until the second connector is connected with the first connector, the resilient plate is restored to allow the latch to abut against an end edge of the opening opposite to the first connector, for avoiding the second connector disengaged from the first connector, the protuberances abut against the inner surface of the side wall for avoiding the fan module disengaged from the side wall.

10. The fan module of claim 9, wherein the chassis further comprises a second bracket latching to the first bracket for mounting the fan between the first bracket and the second bracket.

11. The fan module of claim 10, wherein the second bracket comprises a bottom plate opposite to the main plate of the bracket, and two second side plates extending from two opposite side edges of the bottom plate toward the first bracket, each first side plate comprises two hooks located away from the main plate, each second side plate defines two latching holes away from the bottom plate, the hooks are latched in the corresponding latching holes of the second bracket.

12. The fan module of claim 11, wherein the second bracket further comprises two second end plates perpendicularly extending out from two opposite end edges of the bottom plate and an installing plate protruding from an outer surface of one of the second end plates, the second connector is mounted to the installing plate.

13. The fan module of claim 12, wherein each second end plate defines a vent and each first end plate defines a vent.

14. The fan module of claim 12, wherein the installing plate comprises a positioning plate extending therefrom and defining a positioning hole for the second connector extending therethrough.

15. The fan module of claim 9, wherein the main plate defines a plurality of operating holes adjacent the side edges of the main plate, the fan module is moved through the operating holes.

16. A removable fan module for an electronic apparatus comprising:
a fan electronically connectable to an external power source through a first connector; and
a chassis removably insertable into an electronic apparatus, the chassis having a first bracket with:
a main plate;
a first side plate extending substantially perpendicularly from a first edge of the main plate;
a second side plate extending substantially perpendicularly from a second edge of the main plate, the first side plate opposite, and substantially parallel, to the second side plate;
a first end plate extending substantially perpendicularly from a first end edge of the main plate between the first side plate and the second side plate;
a second end plate extending substantially perpendicularly from a second end edge of the main plate between the first side plate and the second side plate; and
a substantially resilient plate extending from the first end of the main plate and substantially horizontal with the main plate;
wherein, a first and second protuberance extends horizontally outward from each side edge of the main plate;
wherein, a first and second tab extends perpendicularly outward from an outer surface of each side plate adjacent the main plate;
wherein, a latch protrudes from the distal end of the resilient plate;
wherein, the chassis is attachable to the electronic apparatus by pressing the distal end of the resilient plate toward an opening in the electronic apparatus housing with the housing opening including two defined spaces extending outward from each opening edge;
wherein, the resilient plate is deformed until the resilient plate abuts a surface of a wall of the electronic apparatus, inserting the chassis into the electronic apparatus housing so that the first and second protuberances pass through the defined spaces on the opening edges;
wherein, the first connector is connectable to a second connector within the electronic housing to electronically connect the fan to the electronic apparatus, the second connector being positioned within the opening at a first end of the opening;
wherein, when the resilient plate is restored, the resilient plate latch abuts against a second end edge of the housing opening, the second end opening being opposite, and substantially parallel, to the first end edge;
wherein, the restored resilient plate helps to prevent disengagement of the first connector from the second connector and positions the first and second protuberances against an inner surface of the electronic apparatus housing to engage the chassis with the apparatus housing and hold the chassis and fan within the apparatus housing; and
wherein, to remove the fan and chassis, the chassis may be moved to deform the resilient plate, disengage the first connector from the second connector and position the first and second protuberances at the defined spaces of the opening edges so as to allow the protuberances to pass through the defined spaces and the chassis to be removed.

17. The removable fan module of claim 16, wherein the chassis further comprises a second bracket latched to the first bracket for mounting the fan between the first bracket and the second bracket.

18. The removable fan module of claim 17, wherein the second bracket comprises a bottom plate opposite to the main plate of the first bracket, and two third side plates extending from two opposite side edges of the bottom plate toward the first bracket, each side plate of the first bracket comprises two hooks located away from the main plate, each side plate of the second bracket defines two latching holes, the hooks are latched in the corresponding latching holes.

19. The removable fan module of claim 17, wherein the second bracket further comprises two third end plates perpendicularly extending out from two opposite end edges of the bottom plate and an installing plate protruding from an outer surface of one of the third end plates, the second connector is mounted to the installing plate.

20. The removable fan module of claim 19, wherein the installing plate comprises a positioning plate extending therefrom and defining a positioning hole for the second connector extending therethrough.

\* \* \* \* \*